9/29/81 OR 4,292,561

United States Patent [19]

Martin

[11] 4,292,561

[45] Sep. 29, 1981

[54] ATTENUATING MEANS FOR ELECTROACOUSTIC TRANSDUCER

[75] Inventor: Erwin Martin, Munich, Fed. Rep. of Germany

[73] Assignee: Siemens Aktiengesellschaft, Berlin & Munich, Fed. Rep. of Germany

[21] Appl. No.: 54,408

[22] Filed: Jul. 3, 1979

[30] Foreign Application Priority Data

Jul. 17, 1978 [DE] Fed. Rep. of Germany ....... 2831411

[51] Int. Cl.[3] ............................................ H01L 41/08

[52] U.S. Cl. .................................... 310/322; 179/180; 179/110 A; 310/326; 310/324

[58] Field of Search ............... 310/322, 324, 326, 327; 179/110 A, 180; 181/151, 158, 160, 172, 175, 180, 182, 184, 185, 198, 207, 208, 210

[56] References Cited

U.S. PATENT DOCUMENTS

| | | | |
|---|---|---|---|
| 2,645,301 | 7/1953 | De Vries | 179/180 X |
| 3,708,702 | 1/1973 | Brunnert | 310/322 |

FOREIGN PATENT DOCUMENTS

| | | | |
|---|---|---|---|
| 1076182 | 2/1960 | Fed. Rep. of Germany | 179/180 |
| 1412597 | 11/1975 | United Kingdom | 179/180 |

*Primary Examiner*—Mark O. Budd

*Attorney, Agent, or Firm*—Hill, Van Santen, Steadman, Chiara & Simpson

[57] ABSTRACT

An electroacoustic transducer in which resonance ratio effects above 3500 Hz are attenuated by acoustic means, wherein the transducer membrane is disposed in a cavity which is sub-divided thereby, the sound-receiving space at the front side of the membrane being subdivided by a separation plate having acoustic transmission openings therein, a mounting cap forming the front wall of said sound-receiving space and provided with acoustic transmission openings therein, and an attenuation member disposed between the separation disk and the mounting cap, which forms a low-pass filter for sound traveling to said membrane. The invention has particular application in piezo microphones in telephone technology.

8 Claims, 3 Drawing Figures

ATTENUATING MEANS FOR ELECTROACOUSTIC TRANSDUCER

BACKGROUND OF THE INVENTION

The invention is directed to an electroacoustic transducer having a transducer membrane disposed within a cavity, by means of which the volume in the cavity is subdivided into a front membrane space and a back membrane space, with the front membrane space being defined, in part, by a mounting member or cap which is provided with acoustic transmission openings therein, with means being provided in the front membrane space for the attenuation of resonance ratio effects.

It is necessary, for increasing the intelligibility of the speech and for compensation of the frequency-dependent course of the cable attenuation, that the sensitivity of a telephone microphone steadily increase with increasing frequency in the range of 200 Hz through approximately 2500 Hz. Approximately 2.5 dB/octave is desirable.

However, the sensitivity should not exhibit any further increase in the range of 2500 Hz through 3500 Hz since feedbacks between the speaking and listening units in the handpiece of a telephone may be reduced at these frequencies.

Further, it is desirable that the frequency curve above 3500 Hz should drop steeply to avoid an interfering influence of neighboring channels in carrier-frequency communications transmission over long-distance lines, which normally involve a channel width of 4 kHz. In addition, in future PCM transmissions involving half scanning frequency, interference noise in the speech signal occasioned by the compounding is to be suppressed.

In order to achieve high sensitivity in known telephone transducers, the basic oscillation of an oscillator system (oscillator armature, synthetic membrane and coil, and bending plate) are designed with a relatively large mass $m_o$ in the middle of the telephone transmission frequency range at approximately 1 kHz. Compensation of resonance ratio effects of such basic oscillation is sought to be effected by means of a Helmholtz resonator coupled to the rear space or volume behind the membrane. (See Frequenz, Vol. 16/1962, Pages 208 through 215.)

For the increase of the transmission range up to approximately 3.5 kHz, auxiliary resonators and harmonic oscillations have been employed (see German LP Pat. No. 1,961,217), particularly the fourth partial oscillation, by means of a nodal circuit.

Since the auxiliary resonators and harmonic oscillations in part exhibit very disruptive resonance ratio effects, measures are known for the suppression of such disruptive influences by means of a special mounting of the membrane (German LP Pat. No. 1,961,217, German AS Pat. No. 1,288,146) or, by means of the specific design of the membrane per se.

Also, attempts have been made to reduce resonance effects in the travel path of the sound. Thus, it is known to arrange silk gauze behind the sound entrance holes of the mount of a microphone unit, or to dispose a piece of porous foam plastic behind such holes.

These embodiments, however, have the disadvantage that, due to the disposition of an attenuation material directly behind the sound entrance openings, such material can become dirty as a result of speaking into the unit. Consequently, over a period of time, the attenuation resistance changes and thus the frequency response and the sensitivity of the microphone likewise are changed. In addition, cleaning of the microphone unit, other than a possible replacement of the telephone is impractical. Moreover, a gluing of a silk gauze within the unit is relatively expensive. Further, such known attenuation devices disposed behind the sound openings usually are not sufficient to attenuate resonance ratio effects above 2000 Hz.

BRIEF SUMMARY OF THE INVENTION

The present invention therefore has among its objectives, the production of an arrangement utilizing acoustic means for the correction of the frequency curve, by means of which resonance ratio effects above 3500 Hz are almost completely suppressed and which allows an approximately uniform transmission or a proportional control factor to be achieved in the frequency range specified for transmission.

This object is achieved, in accordance with the present invention, by the utilization of a separation plate which is disposed in the front membrane space between the transduce membrane or diaphragm and the mounting cap defining the outer wall of such space. Both such mounting cap and the separation plate are provided with acoustic transmission openings, with the acoustic transmission openings of the mounting cap being laterally displaced with respect to the acoustic transmission openings of the separation plate, in combination with means exhibiting attenuating properties provided in the area of the separation plate and extending across the acoustic transmission openings therein.

A sufficient attenuation is thereby achieved, particularly at high frequencies, and by utilizing such a displacement of the acoustic transmission opening of the mounting cap with respect to those of the separation plate, the attenuating means may be so disposed that a contamination thereof, as a result of speaking into the microphone, is to the greatest possible degree avoided. By varying the characteristics of the means exhibiting such attenuating properties, the low-pass filter thus formed can be matched to the most varied specifications. Thus, within certain limits, the sensitivity can be varied without involving changes in the membrane or its mounting. Further, the limiting frequency $f_o$ and the steepness of the low-pass filter can be matched to various specifications.

It is advantageous to provide the means, exhibiting attenuating properties, in the space between the separation plate and the mounting cap and/or in the space between the membrane and the separation plate, with such means partially filling up such area. As a result, the sound energy flux must first penetrate the material exhibiting attenuating properties approximately in a horizontal direction, resulting in a longer travel path. The flow resistance thereby becomes sufficiently large and is not materially dependent on the tolerances of the material involved.

Advantageously, the material exhibiting attenuating properties can be provided with a disk-like configuration, which disk is disposed within the mounting cap, and in dependence on the selection of the material of such disk, its diameter, thickness and porosity, the steepness, limiting frequency and attenuation of the structure may be varied.

It is particularly advantageous when the mounting cap is provided with a cylindrical, inwardly directed projection and the attenuation disk is provided with a central recess adapted to receive the cylindrical projection, which thereby maintains the disk in the desired operative position.

With such a construction, the operational characteristics of the transducer can be altered merely by an interchanging of the mounting cap and attenuation disk to accommodate variations with respect to the selection of the number and size of the acoustical transmission openings, with the diameter and other dimensions of the mounting cap being correspondingly selected. In addition, an exact positional safeguard of the attenuation disk is provided whereby a displacement of such disk during assembly is impossible. An additional advantage results in that upon interchange of the mounting cap, the oscillator system is not affected as the separation plate and housing form a compact unit.

It may also be expedient to provide the mounting cap and/or separation disk with ribs extending radially outward, with such ribs being disposed behind the acoustic transmission openings, by means of which auxiliary resonances of synthetic parts in the acoustic path can be reduced or avoided in a simple manner.

BRIEF DESCRIPTION OF THE DRAWINGS

In the drawings wherein like reference characters indicate like or corresponding parts.

DETAILED DESCRIPTION

Figure 2:
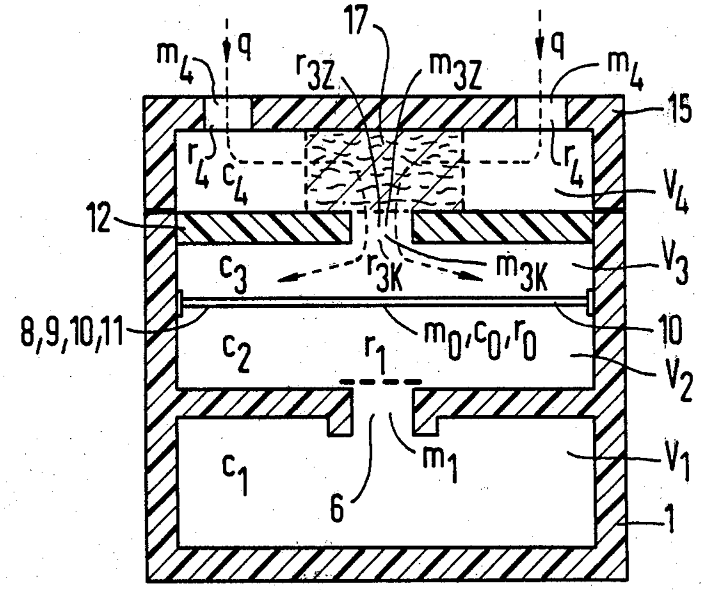
FIG. 2 is a schematic representation of a transducer according to FIG. 1.

Successively disposed within a housing 1 is a carrier 2 which carries a printed board 3 having electronic components on its side facing the bottom of the housing. The board 3 carries two terminal blades or pins 4, only one of which is illustrated in FIG. 2, which terminals project through recesses 5 in the housing and not only form the electrical connection to the exterior but also fixedly determine the position of the carrier 2 and the printed circuit board 3 within the housing. The carrier 2 is provided with two absorption resonators 6 (only one of which is illustrated in FIG. 2) and which are covered by respective silk disks 7.

An annular shaped bearing member 8 is disposed on the carrier 2, upon which is seated a transducer membrane in the form of a transducer plate 10, which is provided with a piezo ceramic layer 9. A similar annular shaped bearing member 11 forms a cooperable retaining support for the transducer plate. The housing 1 is closed by means of a separation plate 12 which, preferably, is inseparably connected to the housing, which plate is provided with a plurality of acoustic transmission openings 13 therein disposed in a circular arrangement. The separation plate 12 also is provided with ribs 14 which extend radially outward at along the side thereof facing the membrane.

The transducer so formed is completed by a mounting cap 15 which is provided with acoustic transmission openings 16 therein, likewise disposed in circular arrangement. The latter acoustic transmission openings are disposed in a circle having a greater diameter than that on which the acoustic transmission openings of the separation plate are disposed. Arranged between the separation plate 12 and the mounting cap 15 is an attenuation disk 17 which has a central opening therein in which is seated a cylindrical projection 18, depending inwardly from the mounting cap 15, with such disk partially filling up the space in front of the separation plate. The diameter of the attenuation disk is so selected that it covers the acoustic transmission openings in the separation plate.

Figure 1:
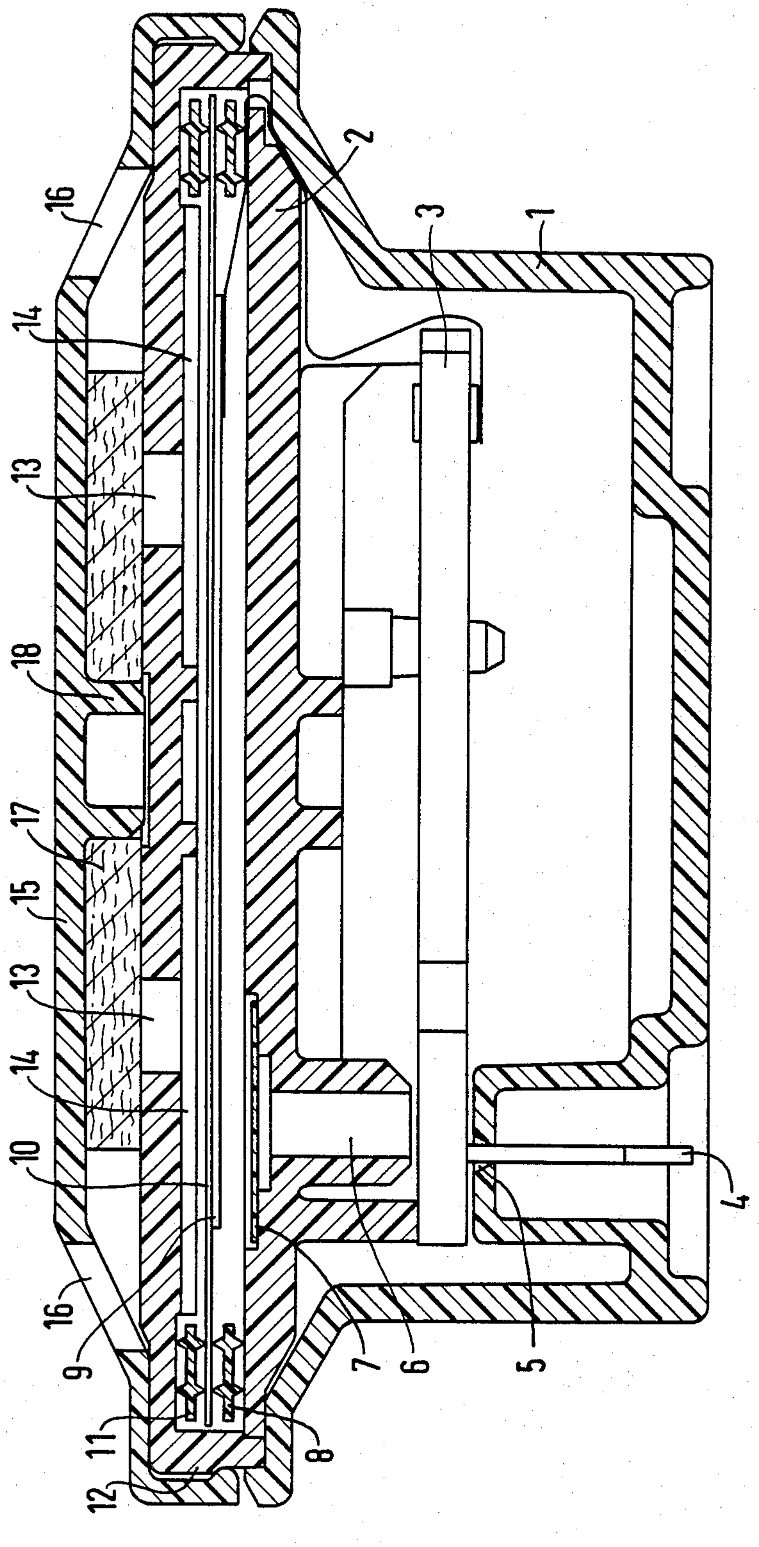
FIG. 1 is a transverse cross section through a transducer according to the present invention.

FIG. 2 is a schematic representation of a transducer in accordance with FIG. 1, employed for example as a microphone, and components of the structure of FIG. 2, which coincide with those of FIG. 1, are designated by the same reference symbols.

The space between the removable mounting cap 15 and the oscillation system 8, 9, 10, 11, is subdivided into two spaces $C_3$ and $C_4$ by means of the separation plate 12.

Air masses $m_3$ and $m_4$ in the openings of the separation plate and mounting cap respectively are coupled by the resiliency $c_4$ of the air volume $V_4$ enclosed by the two components.

This acoustic oscillation structure electrically corresponds to a T-element functioning as a low-pass filter as subsequently discussed with respect to FIG. 3.

The limiting frequency of the low-pass filter so formed is set at the upper limit of the desired transmission range. Thus, $$f_o = \frac{1}{\pi\sqrt{L \cdot C}} = \frac{1}{\pi\sqrt{m}}$$

is valid for the limiting frequency if it is assumed that the air masses in the openings of the mounting cap and separation plate are of equal size, i.e.

$$m = m_3 \approx m_4.$$

The resiliency $c_4$ is selectable within limits by means of the coupling volume $V_4$ (0.5 through 3 $cm^3$) and by means of the effective oscillating surface $S_o$ (3.5 through 5 $cm^2$) of the transducer plate 10. Thus, $$c_4 = \frac{V_4}{\rho \cdot c^2 \cdot So}$$

wherein $\rho$ = density of the air, c = sound velocity of the air, $\rho \cdot c^2 = 1.42 \cdot 10^6$ $g/cm^2s^2$.

The air mass in the channels $$m = n \cdot (\angle + \Delta\angle) S_K.$$

with $$\Delta_\angle = \frac{\pi \cdot \Gamma}{2}$$

aperture correction, is freely selectable by means of the channel length $\angle$, by means of the cross section $S_K$ of the channels, and by means of the plurality n of the channels.

A good low-pass effect is achieved with channel lengths $\geqq 1$ mm (if need be with auxiliary collar), which is easily realizable with the selection of synthetic molded parts for the mounting cap and separation plate.

An enlargement of the channel cross section and a plurality of the channels above a certain measure reduces the low-pass effect, i.e. the translation of the effective masses or, inductivities ($L'_3 = L_3/u_3^2$) at the cross section transfer ($\ddot{u}_3 = S_{3x}/S_o$) in this case functions in the opposite direction. The attenuation must be sufficiently large that the attentuation curve of the low-pass filter proceeds steadily from the pass-through to the blocking range.

The acoustic friction resistance $r_{3K}$ and $r_4$ at the channels walls of the mounting cap and separation plate, i.e., $$r = (1 + 1)S_K \cdot \boxed{H}$$

$\boxed{H}$ flux resistance of air (prop $1/\gamma \cdot \sqrt{f}$) usually is not sufficient therefore. Consequently, the auxiliary attenuation $r_{3Z}$ is derived from the porous foamed plastic disk between the mounting cap and separation plate. The total attenuation and total mass at the separation plate is then $$r_3 = r_{3K} + r_{3Z}$$

$$m_3 = m_{3K} + m_{3Z},$$

in which $m_{3Z}$ represents the additional mass of the air enclosed in the porous material.

Figure 3:
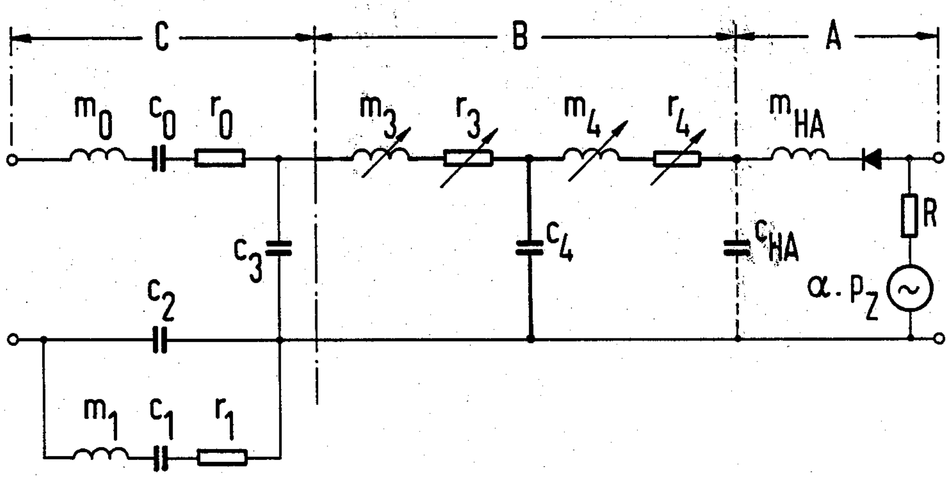
FIG. 3 illustrates the equivalent circuit of FIG. 2.

FIG. 3 illustrates the equivalent circuit diagram of the structure of FIG. 2, with the section A designating the mouthpiece of the telephone hand set, the section B the low-pass filter by means of the mounting cap and separation plate, and section C the mechanical and acoustical oscillation system.

Although I have described my invention by reference to particular illustrative embodiments, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim as my invention:

1. In an electroacoustic transducer having a transducer membrane disposed in a cavity by means of which the volume in the cavity is subdivided into a front membrane space and a rear membrane space, and with a mounting cap terminating the front membrane space and which is provided with acoustic transmission openings, and in which an attenuating means is provided in the front membrane space for the attenuation of resonance ratio effects, the combination of a separation plate disposed in the front membrane space between the membrane and the attenuating means, the separation plate being provided with acoustic transmission openings therein all of which lie radially inwardly of the mounting cap acoustic openings, the attenuating means disposed in the area of the separate plate extending across the acoustic transmission openings therein, and the attenuating means and acoustic openings being positioned relative to one another such that sound waves entering through the cap acoustic openings travel laterally and radially inwardly through the attenuating means and then out of the attenuating means into the separation plate acoustical openings towards the transducer membrane.

2. An electroacoustic transducer according to claim 1, wherein said attenuating means has a disc-like shape.

3. An electroacoustic transducer according to claim 2, wherein said attenuating means has a thickness corresponding to a gap between the separation plate and the mounting cap.

4. An electroacoustic transducer according to claim 1 wherein an absorption resonator covered by a porous layer is disposed on a side of the membrane which is opposite the side of the membrane adjacent the separation plate.

5. An electroacoustic transducer according to claim 1, wherein the mounting cap is provided with a projection and the attenuation means is provided with a cooperable central recess in which said projection extends for fixing the positioning of said attenuating means relative to the mounting cap.

6. An electroacoustic transducer according to claim 1, wherein said separation plate has ribs which extend radially outward on a side adjacent the transducer membrane for reducing auxiliary resonances.

7. An electroacoustic transducer, comprising: a transducer housing forming a cavity with a transducer element mounted within the cavity so as to divide the cavity into a front and back space; and means at the front space for the attenuation of resonance ratio effects comprising acoustic transmission openings at radially outer portions of a front cap of the housing, a separation plate between the transducer element and the front cap having at least one acoustic opening radially inwardly of all of the front cap acoustic openings, and a porous attenuating means between the separation plate and front cap having a thickness corresponding to a gap at such location between the plate and front cap and being positioned such that sound waves entering the front cap acoustic openings pass in the radial direction through the attenuating means towards and then through the radially inwardly separation plate acoustic opening.

8. The transducer of claim 7 wherein the attenuating means comprises a cylindrical porous disc.

* * * * *